United States Patent

Schultheiss et al.

[11] Patent Number: 6,049,162
[45] Date of Patent: Apr. 11, 2000

[54] PULSED ELECTRON BEAM SOURCE AND ITS USE

[75] Inventors: Christoph Schultheiss, Berghausen, Germany; Vladimir Engelko, St. Petersburg, Russian Federation; Gerd Kraft, Karlsruhe, Germany; Gustav Schumacher, Karlsruhe, Germany; Georg Müller, Karlsruhe, Germany

[73] Assignee: Forschungszentrum Karlsruhe GmbH, Karlsruhe, Germany

[21] Appl. No.: 09/070,028

[22] Filed: Apr. 30, 1998

Related U.S. Application Data

[63] Continuation-in-part of application No. PCT/EP96/04763, Nov. 2, 1996.

[30] Foreign Application Priority Data

Nov. 8, 1995 [DE] Germany .......................... 195 41 510

[51] Int. Cl.[7] .............................. H01J 17/26; H01J 61/28
[52] U.S. Cl. .................................. 313/231.01; 313/359.1; 313/360.1; 315/111.81
[58] Field of Search ........................ 313/231.01, 361.1, 313/360.1, 359.1; 315/111.81; 427/596; 219/121.12, 121.15, 121.25, 121.27, 121.35

[56] References Cited

U.S. PATENT DOCUMENTS 5,841,235  4/1999  Engelko et al. ................... 315/111.21
5,897,794  4/1999  Hubbard et al. ................... 219/121.12

OTHER PUBLICATIONS

G.O. Andrianov et al., "Sound–Velocity Anomalies in $V_2O_3$ Crystals Grown by the Verneuil Method", *Sov. Phys. Tech.* 26, pp. 853–846. Jul., 1981.

V.I. Engelko et al., "Pulse Heat Treatment of Material Surface by High–Current Electron Beam", *International Conference on High Power Particle Beams*, 1992, pp. 1935–1941.

Kovalev et al., "Increasing the Energy of a Microsecond–Range Hollow Relativistic Electron Beam Generated by a Multitip Explosive–Emission Cathode", *Soviet Technical Physics Letters*, bD.14, nR. 6, Jun. 1988.

*Primary Examiner*—Vip Patel
*Assistant Examiner*—Michael J. Smith
*Attorney, Agent, or Firm*—Klaus J. Bach

[57] ABSTRACT

In a pulsed electron beam source based on the vacuum principle, comprising a vacuum diode having a multi-point emission cathode with a flange and a plurality of emission points, a control grid, a pulse generator, a magnetic compression unit consisting of field coils, a drift chamber, a target chamber and a synchronization unit, the multipoint emission cathode is embedded in a shield electrode, and the shield electrode is connected to the cathode base by way of a resistor which is so sized that the shield electrode is capable of freely floating.

6 Claims, 1 Drawing Sheet

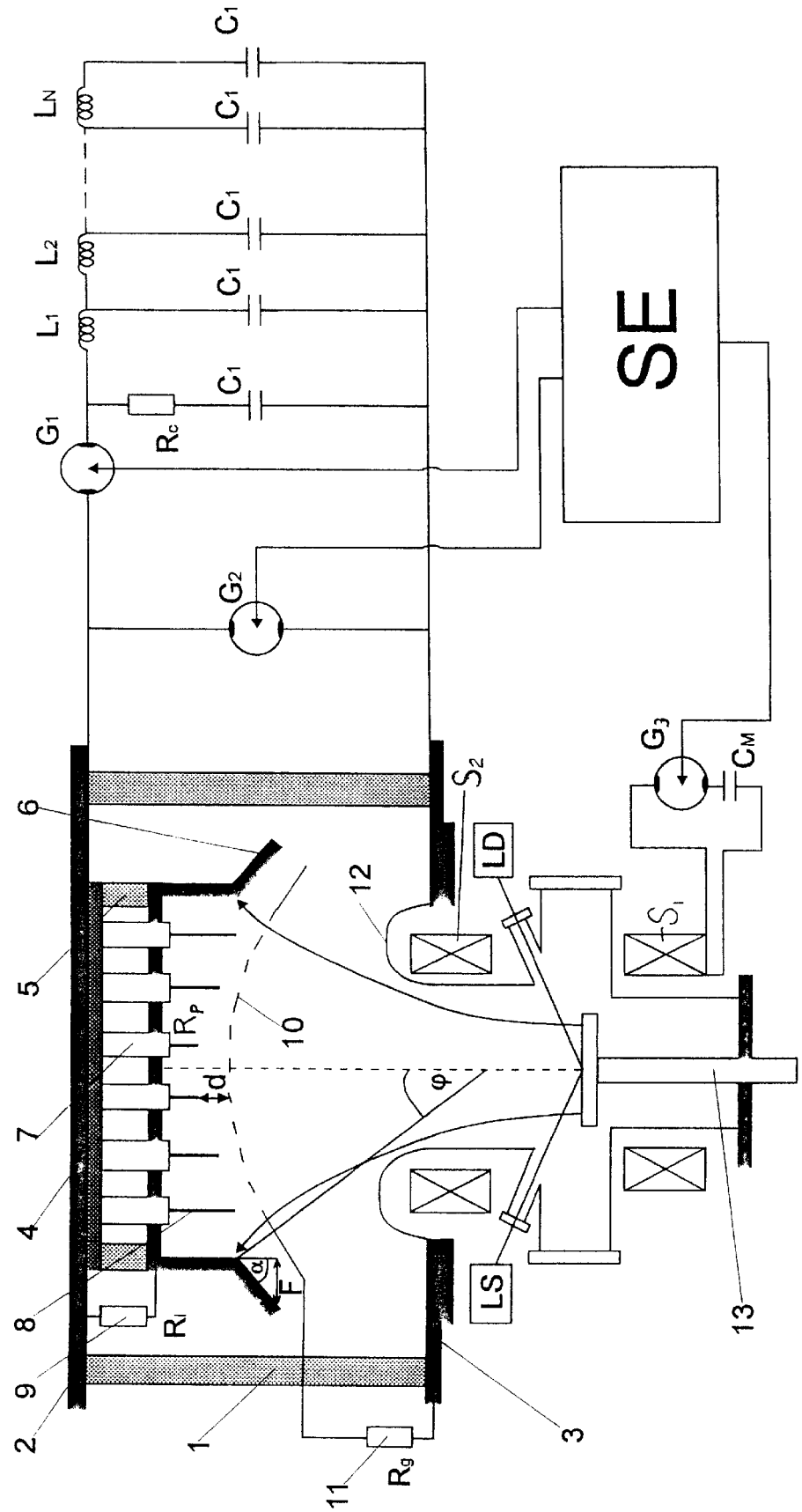

PULSED ELECTRON BEAM SOURCE AND ITS USE

This is a Continuation-in-Part Application of international PATENT application PCT/EP96/04763 filed Nov. 2, 1996 and claiming the priority of German PATENT application 195 41 510.8 filed Nov. 8, 1995.

BACKGROUND OF THE INVENTION

The invention relates to a pulsed electron beam source based on the vacuum diode principle and comprising a vacuum diode with a multi-point emission cathode, a control grid, a pulse generator, a magnetic compression unit including field coils, a drift chamber, a target chamber and a synchronization unit.

The publication V.I. Engelko et al., "PULSED HEAT TREATMENT OF MATERIAL SURFACE", $9^{th}$ Int. Conf. On High Power Particle Beams, 92 p. 1935 (1992) discloses an electron vacuum diode with a multipoint emission cathode which is capable of delivering 60–180 KeV electron beams with current densities of up to 60 A/cm$^2$ and pulse durations of up to 40 μs.

It is the object of the present invention to provide such an electron beam source which is capable of generating pulses of durations of 100 μs and not only pulses with rectangular pulse forms but also pulses with stepped pulse forms.

SUMMARY OF THE INVENTION

In a pulsed electron beam source based on the vacuum principle, comprising a vacuum diode having a multi-point emission cathode with a flange and a plurality of emission points, a control grid, a pulse generator, a magnetic compression unit consisting of field coils, a drift chamber, a target chamber and a synchronization unit, the multipoint emission cathode is embedded in a shield electrode, and the shield electrode is connected to the cathode base by way of a resistor which is so sized that the shield electrode is capable of freely floating.

The advantages of such an electron beam source are summarized as follows:

The time stability of the discharge is insured over the full pulse duration of up to 100 μs. This fact greatly increases the operating life of the apparatus.

The reproducibility regarding the current density which is 10% is improved as compared to earlier apparatus by a factor of 5.

The cross-section of the beam that can be generated is increased by a factor of 3, which is particularly advantageous for a thermal, controlled conversion of large area (<50 cm$^2$) surface layers by electron beam pulses for controlling material surface properties up to a depth of 5 to 50 μm.

The invention will be described below in greater detail on the basis of the accompanying drawing.

BRIEF DESCRIPTION OF THE DRAWINGS

The sole FIGURE shows schematically a pulsed electron beam source.

DESCRIPTION OF A PREFERRED EMBODIMENT

The pulsed electron beam source has the shape of a spherical vacuum diode in which the electron beam is generated, accelerated and focussed onto the entrance to a magnetic compression unit which is also pulsed. There, the beam is compressed to the required flow density before it reaches the target. The voltage supply for the diode as well as the energy supply for the magnetic compression is provided by pulsed power supply units. A control unit synchronizes the process. In accordance with the invention, the arrangement includes a floating shield electrode which is controlled as to its potential and which fulfills three functions:

the protection of the cathode resistors from the return flow of cathode plasma and the target vapors which are formed in the process and may enter the diode thereby changing the diode resistance and causing a short circuit, the control of the potential of the shielding plate to prevent the formation of a surface plasma thereon which may expand into the acceleration gap and cause a short circuit, and an equalization of the boundary distortions of the electric field according to the Piezoelectrode principle.

Furthermore, the diode includes a control grid with variable resistance by which the current density on the target can be controlled.

In addition, a control unit is provided which optically records the effects of the radiation on the target and which provides for a sudden shut-off of the energy supply at the end of the irradiation.

The FIGURE shows the whole apparatus. The diode consists of a high voltage insulator 1, which separates the cathode flange 2 from the grounded anode flange 3. The electrons are generated in the multi-point emission cathode. It comprises a cathode base plate 4, an isolator 5 and a floating shield electrode 6, which is disposed on the isolator 5 and has edges which form a Piezoelectrode. Tightly arranged resistors R$_p$7 extend from the cathode base plate 4 and through the shield electrode 6. At the ends of the resistors, there are provided field emission sources 8 with field emission points forming a spherical raster. The distance between adjacent field emission points 8 is up to 10 mm. The emission points consist of bundles of carbon fibers with fiber diameters of 10 μm. The shield electrode 6 is connected to the cathode base plate 2 by way of a resistor Ri 9. The length of the insulator 5 corresponds about to the length of the cylindrical resistors Rp 7. The width of the openings in the shield plate 6, through which the resistors Rp 7 extend into the diode space are very tightly sized. With this arrangement, the resistors Rp 7 are altogether shielded from influences from the diode space; otherwise, the cathode plasma and the target vapors would detrimentally affect the functioning of the resistors during a pulse and would finally short-circuit them.

The resistors Rp 7 limit the currents of the various field emission sources 8. As a result, the amount of electrons generated on the basis of the surface area is limited essentially to the amount which can subsequently transported away in the electric field. The size of the resistors Rp is determined by the following relationships:

$$R_p = \frac{9\pi Nhd}{S}\left(\frac{m}{2eU_g}\right)^{\frac{1}{2}}$$

$$R_e \gg \left(\frac{2\pi M}{KT_e}\right)^{\frac{1}{2}} \frac{J_p R_p}{enS}$$

wherein Ug is the diode voltage between the control grid 10 and the cathode, N is the number of emission points 8, h is the average height of the emission points, S is the total emitting surface area, $I_p$ is the current through one particular point, e and m are the charge and the mass of the electron and d is the distance between the emission points 8 and the control grid 10, and n and $T_e$ are the density and the electron temperature of the cathode plasma.

The resistor RI 9 has two functions and, in accordance with the invention is so dimensioned that the shield electrode and Re cathode plasma have essentially the same plasma (floating potential). If the shield electrode 6 comes into contact with the cathode plasma, a plasma-wall interaction occurs during which a secondary plasma is generated which expands into the acceleration gap and short-circuits the diode. This is prevented from happening by the free flotation of the shield electrode 6 since the field strength between the cathode plasma and the surface of the shield electrode is small. The second function of Ri 9 is to make sure that the residual charge remaining after completion of the pulse can be discharged from the shield electrode 6. Otherwise, this residual charge would detrimentally affect the firing of the diode in the subsequent pulse.

In order to equalize the marginal distortions of the electrical field, the geometric parameter F of the shield electrode 6 as shown in the FIGURE is selected to be equal d and the angle $\alpha$ is dependent on the optimal radius of curvature of the multi-point emission cathode and is determined by the relationship $\alpha = 67.5° - \phi$. The value d should be about 5 times the distance between adjacent emission points. The control grid 10 consists of a temperature-dependent material and also has a spherical shape. The grid should have a high permeability for electrons. It is connected to the ground potential 3 by way of a variable resistor Rg 11.

The pulsed power supply comprises an inhomogeneous pulse-forming line consisting of capacitors $C_1$ and inductive devices (condensers) $L_1, L_2 \ldots L_n$, a correction resistor $R_c$ the high voltage switch G1 and the short circuit switch G2 (crowbar). The value of the inductivity is determined by the following relationship:

$$L_n = C_1 Z^2 \frac{T_n}{N}$$

wherein $Z(t) = U(t)/I(t)$, $U(t)$ is the total diode voltage, $I(t)$ is the total diode current, T is the pulse duration and N is the total number of the LC—members forming the pulse.

By varying the various inductivities, the pulse form of the pulse power supply can be changed so that desired temperature profiles can be obtained by a time variation of the electron energy (penetration depth).

The magnetic compression unit consists of at least two solenoid coils S1, S2 of the capacity $C_M$ and the high-voltage switch $G_3$. The arrangement of the solenoids and the capacitance are calculated numerically such that the magnetic field provides for an optimal focussing onto the target. The shape of the anode electrode 12 with the central opening through which the electron beam leaves the diode is also the result of a numerical optimization.

The target space 13 is a vacuum chamber, which is connected to the anode flange 3. It is provided with a pump connection and has an access for a target change. It further includes an observation window and two windows for an optical measuring system for the observation of the phase transitions, which result in a change of the optical reflectivity of the surface.

It is the purpose of the control unit SE to provide a series of control voltage pulses to the switches G1 to G3 wherein the switch G1 applies the voltage to the diode, that is, it switches it on and g2 switches it off. G3 switches the coil current on. Switching off of the diode voltage by G2 is achieved in accordance with the invention by way of an optical feedback coupling directly from the target. As the optical reflectivity of the target surface changes upon reaching the melting point, the energy flow to the target is interrupted immediately or after a time delay as desirable depending on the process.

The apparatus operates as follows:

First, the central control unit provides a firing impulse to the switch G3. The condensers C1 are then discharged to the solenoids S1 and S2. After a time delay, which is necessary for the solenoids to reach the maximum value (about 1 millisecond), the central control unit generates a second firing pulse, which closes the switch G1. When the high voltage is applied to the diode acceleration gap between the multipoint emission cathode and the grid which is first at the anode potential, an explosive emission of electrodes is generated at the various carbon fiber bundles. As a result, an essentially homogeneous plasma consisting of electrons and carbon ions is formed in front of the emission points. The electrons are extracted by the electric field which exists between the cathode and the grid. The part $(1-k)*I$ of the electron flow, wherein I is the total electron flow, is absorbed by the grid with the transparency K and is relieved by way of the resistor Rg. As a result, there is a voltage drop-off at Rg of the value $(1-k)*I*Rg$. Consequently, the pulse voltage is divided between the cathode grid and the grid anode. The value for the electron flow I is determined by the Child-Langmuir equation for the cathode grid potential:

$$I = \frac{4}{9}\left(\frac{2e}{m}\right)^{1/2} \frac{[U - (1-k)IR_g]^{\frac{3}{2}} \sin^2(\Theta/2)}{\alpha^2 (r_f/r_g)}$$

wherein U is the diode voltage $r_g$ is the radius of the grid circle and $r_f$ is the focal radius.

$$\alpha^2\left(\frac{r_f}{r_g}\right) = \ln\left(\frac{r_f}{r_g}\right) - 0.3 \ln^2\left(\frac{r_f}{r_g}\right) + \ldots$$

As can be seen from the formula, the level of the electron flow now depends on the resistance Rg. The stability and homogeneity of the electron beam flow during the whole pulse duration of a few microseconds is achieved in the following way:

In order to obtain an electron beam with time stability, the electron plasma must not expand into the cathode grid gap. The kinetic pressure of the electron plasma of the cathode must be smaller than the pressure of the electric field in the cathode grid gap. This condition is fulfilled by the use of the multipoint emission cathode because the source area for the electron emission is limited to the small area of the emission points. Beyond, the carbon ions recombine a part of the electrons in the area of the floating shield electrode 6 to which the ions drift. In this way, a low electron density and a low plasma pressure is obtained. An additional electron emission, for example, by an explosive emission at the surface edge of the floating shield electrode 6 is prevented by limiting the maximal field strength in the cathode grid gap to values of about $10^7$ V/m. Short circuiting of the cathode resistors by a backflow of the cathode plasma is prevented, as already described, by the particular switching and the arrangement of the shield electrode 6.

By the arrangement as described above a stable operation of the electron accelerator up to maximally 100 $\mu s$ is possible. Shortening of the irradiation time, depending, for example, on the optical determination of the melting of the sample, is initiated by activating the switch G2 by the program of the control unit SE.

An area of application for the pulsed large area electron beam source is for example a non-destructive thermal method which includes the sudden heating of a thin surface layer of up to 10 μm depth to a temperature at which the surface is not destroyed but causes all the desired phase changes, mixing of atoms etc,. After this period, which is between 1 and 100 μs, the surface layer cools rapidly down by heat conduction into the interior, such that the desired phase, that is, the mixture formed at the surface freezes.

In the literature, a number of apparatus are already described which attempt to harden the surface of a sample by short-term application of energy. One method is the application of a pulsed laser. The penetration depth of laser energy into the material surface is negligible. It is only 20 nm. In addition, the laser energy can be effectively coupled into the surface only by way of an ablation plasma which detrimentally affects the surface. The highest temperature is obtained at the surface. The heat application is generally associated with a relatively large erosion. Inhomogeneities in the power density are difficult to control. Since plasma sources have no switch-off characteristics, the initial high energy plasma front is followed by a low energy plasma which prevents the surface from cooling down rapidly and, since electrode material is usually included in the plasma, the surface is contaminated. Attempts to cut off the subsequent plasma flow by pulsed inhomogeneous magnetic fields are expensive and have only limited effects since recombining atoms pass through the magnetic barrier.

Also described in the literature are pulsed electron beam sources which are capable of melting surfaces for a short period. These are pulsed low pressure gas discharge devices with pulse durations of far below one microsecond. The energy coupling is flat toward the end of the pulse. There is generally no impedance adaptation between the energy storage (condenser bank) and the electron source so that after the main impulse, there will be attenuated oscillations which supply additional energy to the surface and delay the cooling of the surface.

However, electrons have the advantage that they penetrate relatively deeply into a material as compared to ion and laser energy. A 100 keV electron penetrates steel for example to a depth of 20 μm. These are depths which are of interest for surface treatment processes since only treatments with sufficient depth will provide for durable results.

The method for the thermal treatment of surfaces with the aim to modify the surface structure resides first in the controlled coupling-in of process energy into a surface layer of 5–50 μm in depth over a period of 1–100 μs with a power density of 1–10 MW/cm², which leads to the melting or the breaking of interatomic or respectively, molecular bonds and to uncommon mixtures of elements and metastable phases which otherwise can exist only at high temperatures. Only the electron beam guarantees an almost isothermal heating of a surface layer of the necessary thickness of several 10 μm.

Then follows the quenching phase. This phase is of greatest importance with the present method. The energy coupling is interrupted within a very short time (<1 μs). The heat of the surface layer is conducted into the material at a speed which depends on the specific heat conductivity of the material and the depth of the layer. since the structure states which occur normally only at high temperatures are frozen, and undesirable crystalline reorganizations are prevented only if a cool-down rate in the area >$10^6$ K/s is achieved, certain process parameters such as pulse duration, electron energy and current density have to be controlled accordingly.

With the knowledge of the material data of a body whose surface is to be modified such as
   specific heat conductivity
   heat capacity
   phase diagram with desired structure state
   cool off rate in K/s for freezing the structure state
   density p1 it is possible to determine the maximum layer thickness which can be heated using the heat conduction equation.

As already mentioned, only an electron beam can provide for isothermal heating of the surface layer of a body. With the determination of the maximally heatable layer thickness, this means that
   the accelerator voltage should be so selected that the electron penetration depth equals the layer thickness
   the current density should be so selected that the layer reaches the desired temperature
   the energy supply is so suddenly interrupted that the desired cool off rate is obtained.

For the common materials to be treated electron beam energies of between 50 and 150 KeV are sufficient. The current density is about 50 A/cm².

If one would use ion beams for the same purpose 10 times the acceleration energies would be needed notwithstanding the fact that there are no ion accelerators which would be capable of providing such high current densities in the required period of time. In addition the surface layer would be contaminated by the types of ions and the impulse transfer by the ions whereby the material surface would be damaged by the sputter effect.

The field of use for this method is not limited to changing the surface structure of metals, alloys, intermetallic alloys and inorganic compounds but it may also be used for the strengthening or the melting of layers of metals, alloys, intermetallic alloys, organic or inoganic compounds applied earlier to various substrate materials. It is for example possible to relocate implanted ions which are first positioned at intermediate grid locations to predetermined grid locations. With the high cool-down rate, surface structures can be realized which could otherwise not exist. The layer can have for example structures which are somewhere between amorphous and monocrystalline or are in a metastable phase. Conventionally non-hardenable materials can be provided with a hardened surface layer.

As an example surface hardening experiments on conventional hydraulic valve lifters of a suction Diesel engine are presented: The surfaces of the plates of the hydraulic valve lifters were treated by an electron beam pulse with the following parameters: Energy density 2 MW/cm², electron energy 140 KeV and pulse duration 20 μs. After irradiation, the hydraulic valve lifters were tested in a Diesel engine for long time wear behavior (RTM measurement). In this test, the wear of the non-treated partner (camshaft cams) as well as the wear of the treated valve lifter were measured. It was found that the wear on the treated hydraulic valve lifters was only one fifth of the wear of the untreated hydraulic valve lifters and that even the wear on the untreated camshaft cams which operated treated valve lifters was smaller by the factor of 2.5 than the wear of camshaft cams operating untreated valve lifters.

It is assumed that the reason herefor are the increased hardness which was increased by the irradiation from 700 HV to 1800 HV and the fine crystalline surface structure of the surface layer obtained by the melt conversion process.

The electron source can be utilized as follows:

i) changing the surface of metals, alloys, intermetallic alloys and organic and inorganic compounds ii) for the solidification or respectively, the melting of previously applied layers of metals, alloys, intermetallic alloys, organic and inorganic compounds on any substrate material and for forming alloys with the metallic layers, iii) for the annealing of previously implanted atoms in a material surface, iv) in order to obtain surface structures which are between amorphous and monocrystalline or which should have metastable phases, v) for the smoothing of rough surfaces wherein
  a) oriented pulsed energy in the form of a homogeneous pulsed electron beam with a diameter of >6 cm, an energy of 50 to 200 KeV and a current density of up to 50 A/cm$^2$ reaches the surface and
  b) penetrates the material to a depth corresponding to the electron energy so that a layer of up to some 10 mm in depth is covered, and
  c) during a time period of 1–100 $\mu$s the layer is heated to such a temperature that, while no surface erosion occurs, surface processes can occur within that period which have the result and the aim that;
  d) the layer melts and inter-atomic or respectively, intermolecular bonds are broken and new mixtures of elements or metastable phases are formed, and
  e) for the freezing of such structure states outside of the thermodynamic equilibrium or respectively, to avoid undesired reorganizations, the energy supply is suddenly interrupted after the heat up period so that, depending on the heat conductivity of the material and the thickness of the heated layer, the heat is conducted from the surface layer to the interior of the material at a cool-down rate of more than $10^6$ K/s.

What is claimed is:

1. In a pulsed electron beam source based on the vacuum principle, comprising: a vacuum diode having a multi-point emission cathode (MPEK) with a flange and a plurality of emission points, a control grid, a pulse generator, a magnetic compression unit consisting of field coils, a drift chamber, a target chamber and a synchronization unit, the improvement, wherein said multipoint emission cathode (MPEK) is embedded in a free-floating shield electrode, and said shield electrode is connected to the cathode base by way of a resistor which is so sized that said shield electrode is capable of freely floating.

2. A pulsed electron beam source according to claim 1, wherein said shield electrode has the shape of a pot with a bottom including bores and resistor bodies mounted on a cathode base have ends extending through said bores in said shield electrode, and emission points are mounted on the resistor bodies and project therefrom.

3. A pulsed electron beam source according to claim 1, wherein said shield electrode has a circumferential edge which is inclined outwardly by an angle a which is determined by the principle of the piezoelectrode.

4. A pulsed electron beam source according to claim 1, wherein said shield electrode has, at its open end a diameter which is larger than its diameter at its closed bottom by 2*F, wherein F equals the distance d between the control grid and the emission points.

5. A pulsed electron beam source according to claim 1, for the thermal large area (50 cm$^2$<) non-destructive conversion of a surface layer by means of one or several electron beam pulses for influencing the material properties up to a depth of 5 to 50 $\mu$m.

6. A pulsed electron beam source according to claim 5, wherein the pulse form of said electron beam source contains steps for providing a desired temperature profile in the surface being treated.

* * * * *